(12) United States Patent
Pekny

(10) Patent No.: US 6,553,510 B1
(45) Date of Patent: Apr. 22, 2003

(54) MEMORY DEVICE INCLUDING REDUNDANCY ROUTINE FOR CORRECTING RANDOM ERRORS

(75) Inventor: Theodore T. Pekny, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,687

(22) Filed: Sep. 2, 1999

(51) Int. Cl.[7] ................................................. G06F 11/00
(52) U.S. Cl. .............................. 714/6; 714/8; 714/710
(58) Field of Search ............................ 714/5, 6, 7, 8, 714/42, 710, 711, 48; 365/200

(56) References Cited

U.S. PATENT DOCUMENTS

| | | | | |
|---|---|---|---|---|
| 5,268,870 A | * | 12/1993 | Harari | 365/218 |
| 5,740,114 A | * | 4/1998 | Hirano et al. | 365/200 |
| 5,936,970 A | * | 8/1999 | Lee | 371/10.2 |
| 5,936,971 A | * | 8/1999 | Harari et al. | 371/10.2 |
| 5,956,473 A | * | 9/1999 | Ma et al. | 395/182.03 |
| 5,987,632 A | * | 11/1999 | Irrinki et al. | 714/711 |
| 6,011,722 A | * | 1/2000 | Bude et al. | 365/185.24 |
| 6,149,316 A | * | 11/2000 | Harari et al. | 395/182.06 |
| 6,199,177 B1 | * | 3/2001 | Blodgett | 714/7 |

* cited by examiner

*Primary Examiner*—Robert Beausoliel
*Assistant Examiner*—Marc M Duncan
(74) *Attorney, Agent, or Firm*—Schwegman, Lundberg, Woessner & Kluth, P.A.

(57) ABSTRACT

A memory device and method the pact random memory cell failures in a packaged memory device. The memory device is automatically programmed to replace a defective memory cell with an available redundant memory cells. The defective memory cell can be detected during either an erase operation or a program operation. The redundant memory cells can be located in a separately erasable location from primary memory cells to allow data stored in the primary memory cells to be copied to the redundant memory cells when a defect is detected during a program operation.

18 Claims, 5 Drawing Sheets

MEMORY DEVICE INCLUDING REDUNDANCY ROUTINE FOR CORRECTING RANDOM ERRORS

TECHNICAL FIELD OF THE INVENTION

The present invention relates generally to flash memory devices and in particular the present invention relates to a flash memory device having a redundancy routine to correct random memory cell errors.

BACKGROUND OF THE INVENTION

Electrically erasable and programmable read-only memory devices having arrays of what are known as flash cells, also called flash EEPROMs or flash memory devices, are found in a wide variety of electrical devices. A flash memory device is typically formed in an integrated circuit. A conventional flash cell, also called a floating gate transistor memory cell, is similar to a field effect transistor, having a channel region between a source and a drain in a substrate and a control gate over the channel region. In addition the flash cell has a floating gate between the control gate and the channel region. The floating gate is separated from the channel region by a layer of gate oxide, and an inter-poly dielectric layer separates the control gate from the floating gate. Both the control gate and the floating gate are formed of doped polysilicon. The floating gate is floating or electrically isolated. The flash memory device has a large number of flash cells in an array where the control gate of each flash cell is connected to a word line and the drain is connected to a bit line, the flash cells being arranged in a grid of word lines and bit lines.

A flash cell is programmed by applying approximately an appropriate voltage to the control gate, a somewhat reduced voltage on the drain, and grounding the source and the substrate to induce hot electron injection from the channel region to the floating gate through the gate oxide. The voltage at the control gate determines the amount of charge residing on the floating gate after programming. The charge affects current in the channel region by determining the voltage that must be applied to the control gate in order to allow the flash cell to conduct current between the source and the drain. This voltage is termed the threshold voltage of the flash cell, and is the physical form of the data stored in the flash cell. As the charge on the floating gate increases the threshold voltage increases.

Data is stored in conventional flash memory devices by programming flash cells that have been previously erased. A flash cell is erased by applying approximately negative voltage to the control gate, and an appropriate voltage to the source, grounding the substrate and allowing the drain to float. In an alternate method of erasure the control gate is grounded and a large voltage is applied to the source. The electrons in the floating gate are induced to pass through the gate oxide to the source by Fowler-Nordheim tunneling such that the charge in the floating gate is reduced and the threshold voltage of the flash cell is reduced. Flash cells in a flash memory device are grouped into blocks, and the cells in each block are typically erased together.

A flash cell is read by applying approximately a voltage to the control gate, and a lower voltage to the drain, and grounding the source and the substrate. The flash cell is rendered conductive and current in the cell is sensed to determine data stored in the flash cell. The current is converted to a voltage that is compared with one or more reference voltages in a sense amplifier to determine the state of the flash cell. The current drawn by a flash cell being read depends on the amount of charge stored in the floating gate.

The capacity of flash memory devices to store data is gradually being increased by reducing the size and increasing the number of flash cells in each integrated circuit. The reduction in the size of the flash cells renders them more vulnerable to defects. Typical flash memory devices include redundant memory array locations which can be selectively programmed during manufacturing to replace the defective memory locations. The redundancy programming is usually performed during integrated circuit a die probe operations. After the memory device is packaged and in used by an end-user, the memory device can experience random memory cell failures. These memory failures often result in the need to replace the memory device.

For the reasons stated above, and for other reasons stated below which will become apparent to those skilled in the art upon reading and understanding the present specification, there is a need in the art for a memory device which includes redundant circuitry that allows for collection of random memory cell failures which occur after the memory device is packaged.

SUMMARY OF THE INVENTION

The above mentioned problems with memory devices and other problems are addressed by the present invention and will be understood by reading and studying the following specification.

In one embodiment, a memory device includes an array of primary memory cells, redundant memory cells, and access circuitry coupled to the array of primary memory cells and the redundant memory cells for selectively accessing either primary memory cells or redundant memory cells in response to externally provided address signals. A plurality of non-volatile fuse cells are coupled to the access circuitry to determine if the primary memory cells or above redundant memory cells are selectively accessed in response to the externally provided address signals. Control circuitry coupled to the plurality of non-volatile fuse cells to selectively program the fuse cells in response to a detected failure is used to detect a primary memory cell failure encountered during either a program or an erase operation.

In another embodiment, a method of correcting random memory cell failures in a memory device includes initiating an erase operation on a plurality of primary memory cells, individually verifying each one of the plurality of primary memory cells to determine in each memory cell has been properly erased, applying one or more additional erase operations on a defective one of the plurality of primary memory cells which fails to properly verify that an erase operation was successful, and programming access circuitry to replace the defective memory cell with an available redundant memory cell.

DETAILED DESCRIPTION OF THE INVENTION

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
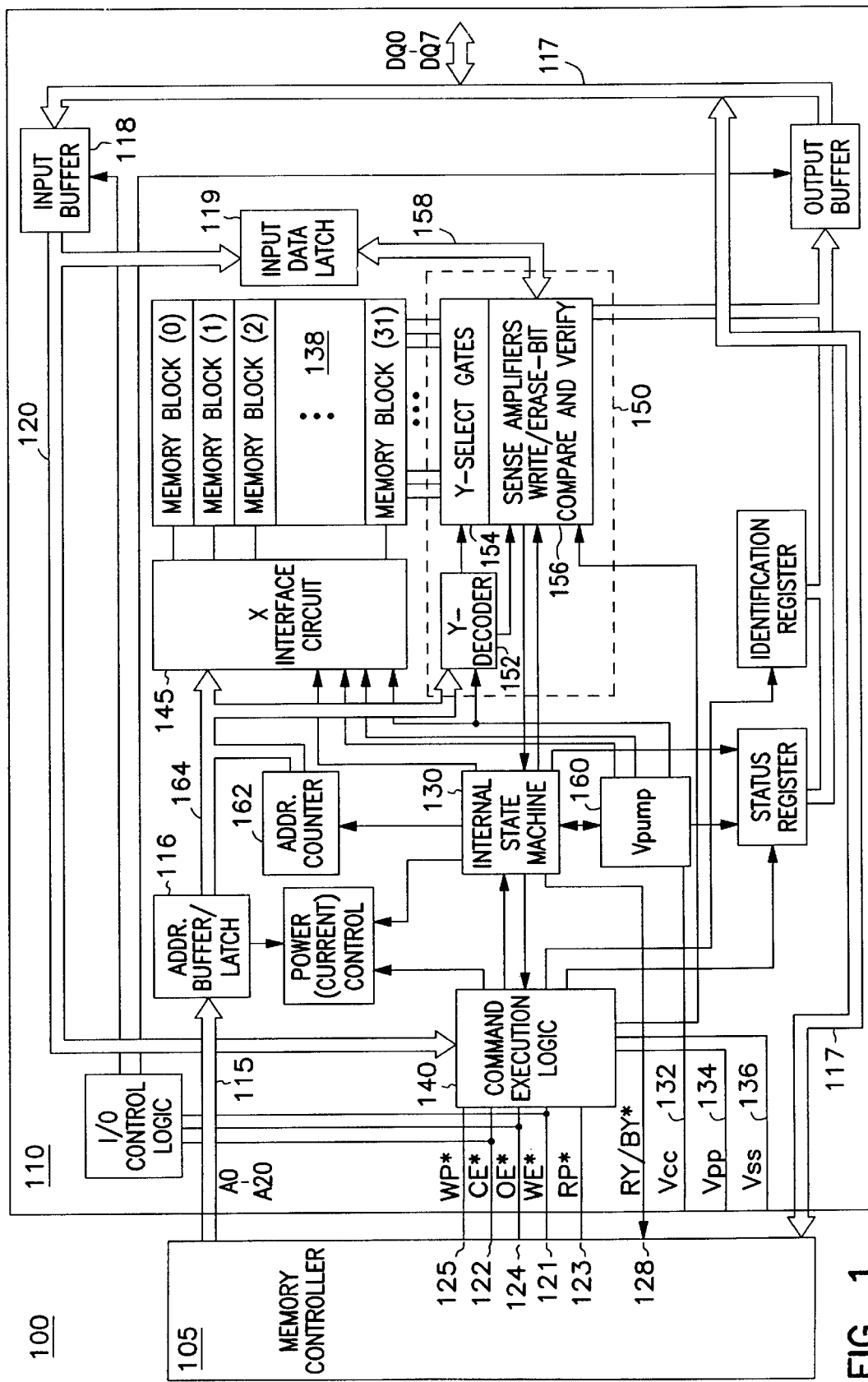
FIG. 1 is a schematic diagram of a flash memory system according to an embodiment of the present invention.

FIG. 1 is a schematic diagram illustrating a flash memory system 100 according to an embodiment of the present invention. The memory system 100 includes a memory controller 105 and a flash memory integrated circuit (IC) 110. The controller 105 includes a control device such as a microprocessor to provide interface signals to the IC 110. The interface signals include address signals provided over multiple address lines 115 to an address buffer and latch 116, and data signals communicated over multiple data lines 117. The data lines 117 are coupled to an input buffer 118 which stores the data signals for transfer to an input data latch 119 over multiple internal data lines 120. Other interface signals provided by the controller 105 include a write enable signal WE* at node 121, a chip enable signal CE* at node 122, a reset/power-down signal RP* at node 123, an output enable signal OE* at node 124, and a write protect signal WP* at node 125, all of which are active low signals. The IC 110 provides a status signal RY/BY* to the controller 105 at node 128 to indicate the status of an internal state machine 130. The IC 110 also receives a positive power supply voltage $V_{CC}$ at node 132, a write/erase supply or programming voltage $V_{PP}$ at node 134, and a reference voltage such as a substrate ground voltage $V_{SS}$ at node 136 which is approximately 0 Volts.

The IC 110 includes an array 138 of floating gate transistor memory cells or flash cells arranged in 32 flash cell blocks. Each block in the array 138 contains 64 kilobytes of flash cells. Flash cells in each block are erased as a group at the same time. A command execution logic module 140 receives the above-described interface signals from the controller 105. The module 140 controls the state machine 130 which controls individual steps necessary for programming, reading, and erasing the flash cells in the array 138. More specifically the state machine 130 controls detailed operations of the IC 110 such as providing write and block erase timing sequences to the array 138 through an X-interface circuit 145 and a Y-interface circuit 150.

The Y-interface circuit 150 provides access to individual flash cells through data lines in the array 138. Data lines in the Y-interface circuit 150 are connected to a bit line driver circuit (not shown). The Y-interface circuit 150 includes a Y-decoder circuit 152, Y-select gates 154, and sense amplifiers and write/erase bit compare and verify circuits 156. The X-interface circuit 145 provides access to rows of flash cells through wordlines in the array 138, which are electrically coupled to the control gates of the flash cells in the array 138. The X-interface circuit 145 includes decoding and control circuits for erasing the blocks of flash cells in the array 138. The write/erase bit compare and verify circuits 156 are coupled to exchange data with the input data latch 119 over a set of internal data lines 158.

The IC 110 includes a charge pump circuit 160 to generate an elevated voltage Vpump for programming, erasing, or reading the flash cells in the array 138. The pump circuit 160 is coupled to receive the positive power supply voltage $V_{CC}$ from the node 132 and provides the voltage Vpump to the X-interface circuit 145, the Y-decoder circuit 152, and the state machine 130 over a plurality of lines. In an alternate embodiment of the present invention, the pump circuit 160 may provide a different elevated voltage over each of the lines shown in FIG. 1. The state machine 130 controls an address counter 162 which is capable of providing a sequence of addresses on an internal set of address lines 164 coupled between the address buffer and latch 116, the X-interface circuit 145, and the Y-decoder circuit 152.

Figure 2:
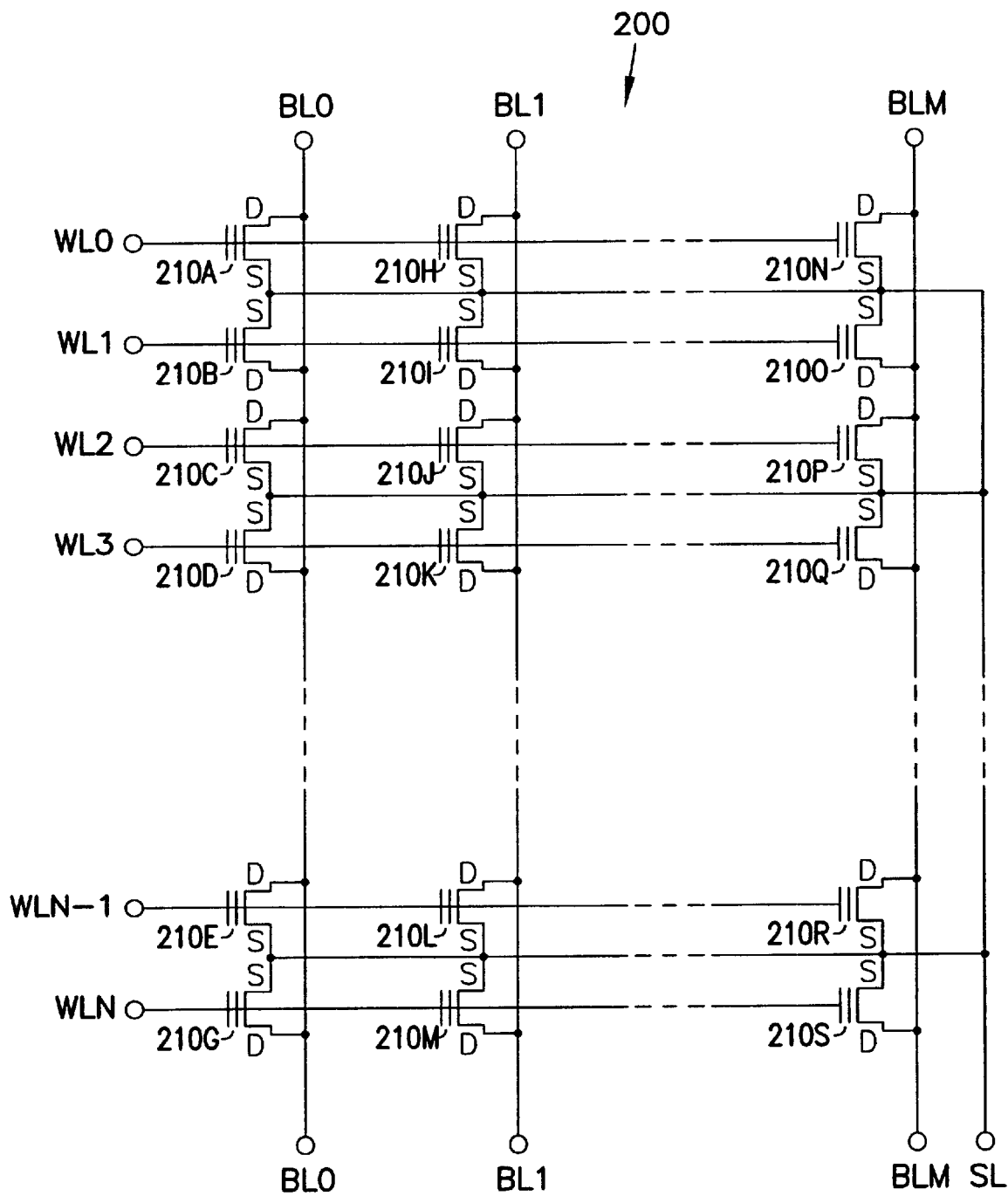
FIG. 2 is a schematic diagram of a block of flash cells in the memory system of FIG. 1.

FIG. 2 is an electrical schematic diagram of a block 200 of flash cells 210A–210S in the array 138 according to the embodiments of the present invention. Some flash cells in the block 200 are omitted from FIG. 2 for purposes of clarity. The flash cells 210 are arranged in rows and columns. All of the flash cells 210 in a particular column have drains D connected to a common bit line BL and all of the flash cells 210 in a particular row have control gates connected to a common word line WL. The bit lines BL are identified as BL0-BLM and the word lines WL are identified as WL0-WLN. All of the flash cells 210 in the block 200 have sources S connected to a common source line SL. The remaining flash cells in the array 138 are arranged into separate blocks having separate source lines. The flash cells in different blocks are erased independently to reduce the required erase current.

The flash cells 210 are arranged in column pairs, with each flash cell 210 of the pair sharing a common source S. For example, a flash cell pair 210J and 210K have a common source S connected to the source line SL. The drains D of the flash cells 210 are connected to the bit line BL associated with the column in which the flash cells 210 are located. For example, the flash cell pair 210J and 210K have their drains D connected to a common bit line BL1.

A typical flash memory device includes a numerous blocks of memory cells which are typically erased at one time and then individually programmed. Two types of errors can be experienced as the memory cells are programmed. The first error is encountered when a memory cell will not erase properly. The second error can be encountered when a memory cell will not properly program. In one embodiment of the flash memory device of the present invention, the memory array block is erased and each memory cell in the block is read to verify that it has been properly erased. If the memory cell is not erased, an additional erase voltage pulse is applied to the memory array block. Care is taken during this operation to avoid over-erasing the flash memory cells. If, however, a flash memory cells will not verify that it has been properly erased after a predetermined number of erased pulses the flash memory device determines that the memory cell is defective. One embodiment of the redundancy routine of the present invention is implemented when a memory cell is determined to be defective during an erase operation, as explained in greater detail below.

Figure 3:
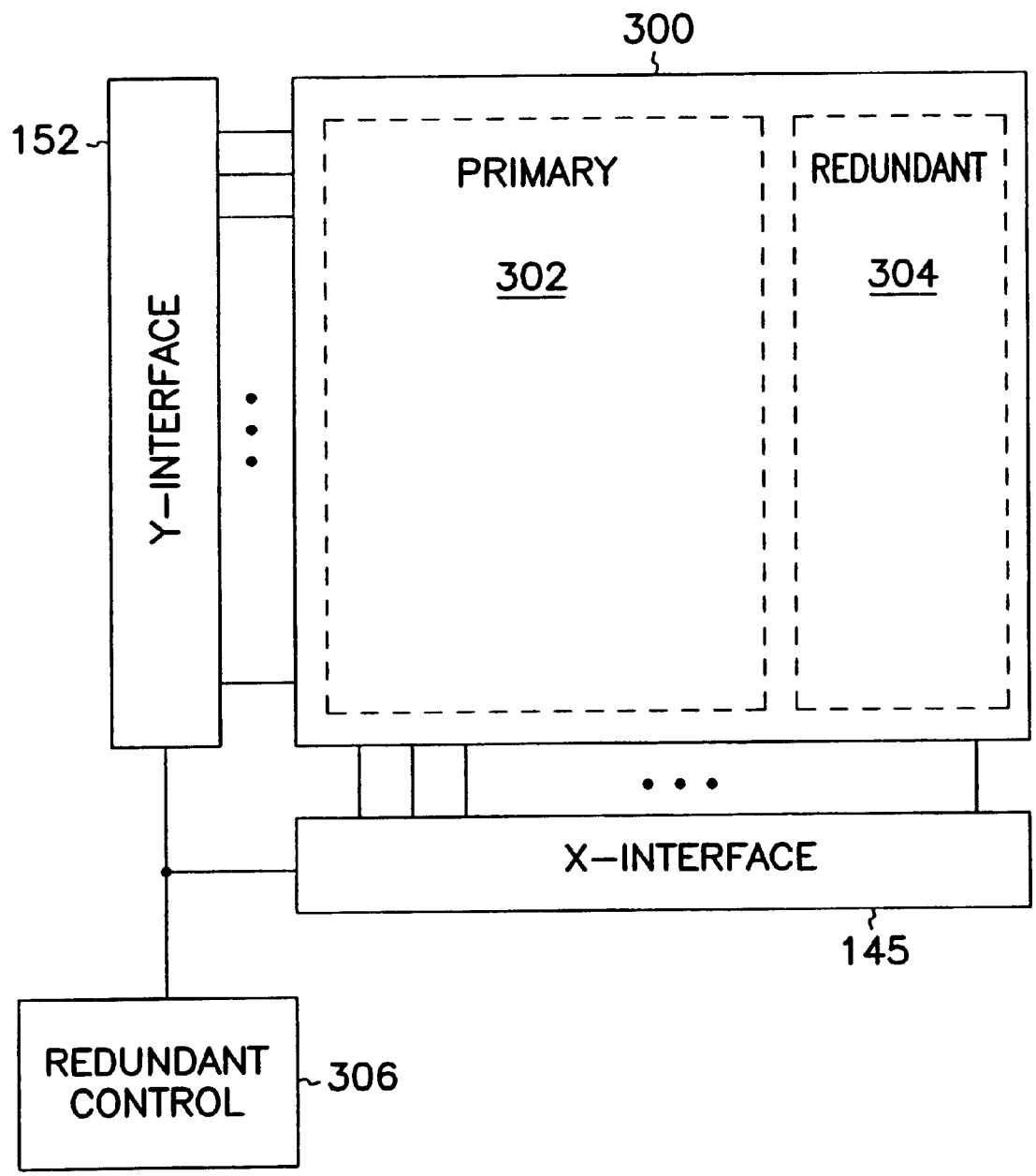
FIG. 3 is a block diagram of a portion of a memory device of the present invention.

Referring to FIG. 3, a simplified block diagram of a portion of the memory device memory cell array and supporting circuitry is provided. The memory device includes a memory cell block 300. The memory cell block can be a sector, or other portion of the memory array which is erased at one time. That is, all memory cells located in the memory block are erased at one time. The cells located in the memory block are then individually programmed as required. The memory cell block includes primary memory cells, or bits, 302 and redundant memory cells 304. In one embodiment the redundant memory cells are located in the same erasable memory block as the primary memory cells. In a second embodiment, the redundant memory cells are located in a separately erasable location, as explained below.

A memory device also includes y-decoder 152 and an x-interface 145, as explained above, for selectively accessing memory cells of the block 300 in response to externally provided address signals. A redundant control circuit 306 is provided to program the addressing circuitry such that when an addresses is received for the primary memory cells 302, memory cells located in the redundant memory cell location 304 are accessed. It will be appreciated by those skilled in the art after setting the present invention that the redundant control circuit can be located as part of the command control circuitry. The redundant control circuitry includes a plurality of flash memory cells which are used to reprogram memory cell address locations (including sector, and column locations) and input/output data paths. The redundant memory cell programming of the present invention is similar to traditional memory cell redundant programming which is performed during integrated circuit die probe testing. The traditional redundant programming, however, is performed prior to packaging the integrated circuit die.

The present invention, as explained herein, performs the redundant programming after the memory device is packaged and while the memory device is in operation. Fabrication and environmental variables often result in single member cell failures which are not easily identified prior to packaging. In fact, random memory cell failures can occur after hundreds of thousands of operating cycles. Currently when a random memory cell failure is encountered, the memory device indicates that an error has occurred but cannot correct the error. In contrast, the present invention re-programs the memory device such that available redundant memory cell locations are programmed to replace a location including a defective memory cell.

Figure 4:
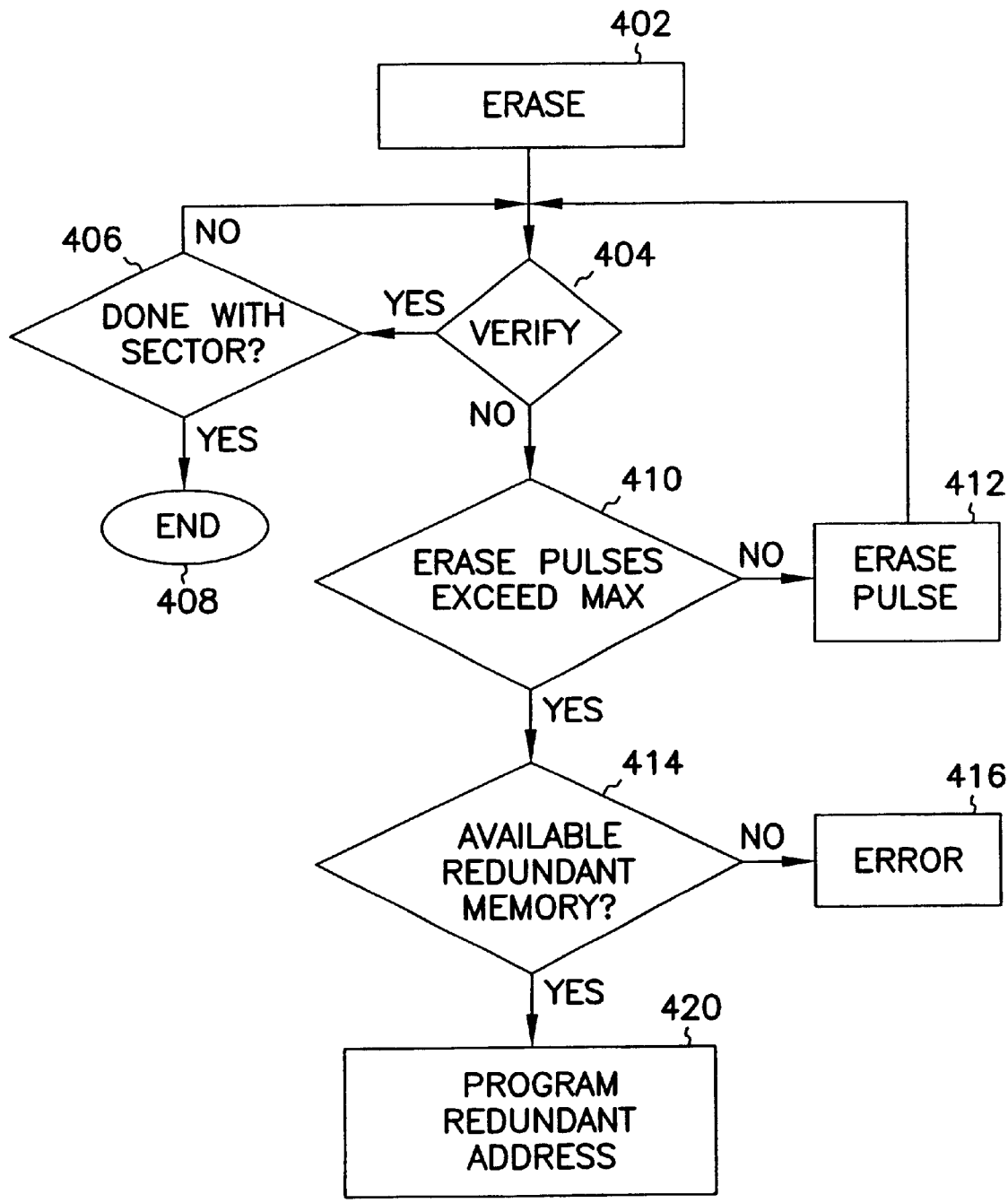
FIG. 4 is a flowchart illustrating one method of the present invention.

Referring to FIG. 4, a method, or algorithm, is described for re-programming a memory device when a random memory cell failure is detected. The method includes initiating an erase operation 402 of the memory cell block. In one embodiment this step includes programming every memory cell in the memory cell block to a common logic state. That is, in one embodiment every memory cell is programmed to logic 0. An erase verification step can be provided after the memory cells are programmed as a verification that the memory cells have been programmed. A voltage pulse is applied to every memory cell in the sector to erase the memory cells to a logic 1. The memory device then verifies each memory cell located in the memory cell block with an erase verification step 404. If it is verified that the tested memory cell has been properly erased, the decision is made at step 406 to determine if the entire memory cell sector has been verified. If every cell has been verified, the erase operation is complete 408. If memory cells remain in the sector which have not been verified, verification step 404 is performed on the remaining memory cells. If the erase verification step determines that the memory cell has not been properly erased a decision is made at step 410 to determine if a maximum number of the erase pulses has been applied to the memory cell. It will be appreciated by those skilled in the art that a predetermined number of erase pulses is selected by the memory device manufacturer to indicate that a memory cell failure is encountered. If the maximum number of erase pulses has not been exceeded an additional erase pulse is applied, step 412, and the erase verification process is again performed. The erase pulse operation 412 can include a soft program operation which helps prevent an over-erase state.

If the maximum number of erase pulses has been exceeded the memory device determines if there are available redundant memory locations, step 414. If the memory device does not have available redundant memory the memory device indicates that an operating error has been encountered, step 416. If redundant memory locations are available, however, the memory device programs the control circuitry of the memory device to access the redundant memory cells in response to address locations of the defective primary memory cell locations, step 420. The memory device, in one embodiment, programs a plurality of flash memory cells which operate as fuse cells to match the addresses of the defective memory location with an address of the redundant memory locations. The amount of information which used the programmed fuse cells will depend upon the design of the memory device. In one embodiment fuse bits may be used to match memory array sector and column addresses, and input/output data paths. It is anticipated that a plurality of fuse bits may be required, in some embodiments one or more bytes of data may be required to programs the redundant memory cell locations.

Because the redundant memory cells are located in the same erasable memory array location as the primary memory cells, the redundant memory cell has been properly erased and can be programmed in subsequent operations. To correct for random memory cell failures which are accounted during programming operations, however, redundant memory cell locations which can be individually erased are necessary. That is, if a random memory cell failure is encountered after half of the memory cells located in the block have been programmed, the entire memory cell array can be erased prior to programming redundant memory cells.

Figure 5:
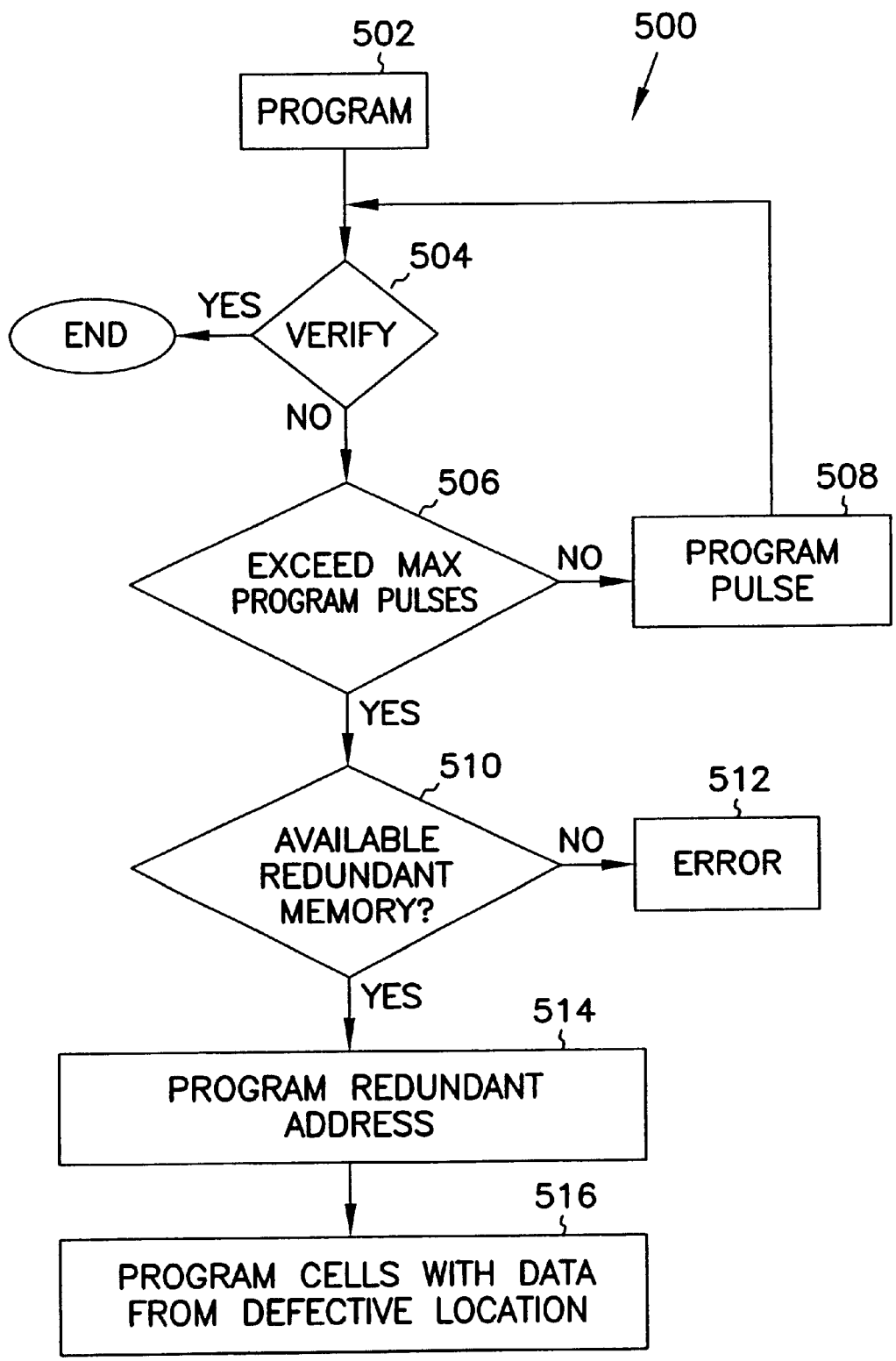
FIG. 5 is a flowchart illustrating another embodiment of a method of the present invention.

Referring to FIG. 5, a simplified method 500 of correcting random memory cell failures encountered while programming is described. The method begins by initiating a program operation 502 at a specified memory location. The memory operation includes applying appropriate voltages to the selected memory cell(s) to program the memory cell to an appropriate data state. A verified operation 504 is performed to verify that the memory cell has been properly programmed. If the memory cell has been properly programmed and verified the program operation is complete. If the memory device cannot verify that the memory cell has been properly programed, a determination is made at step 506 to determine if a maximum number of program pulses has been exceeded. If the maximum number of program pulses has not been exceeded, an additional program pulse (s) is applied at step 508 and the verification operation is again performed. If the maximum number of program pulses has been reached, the memory device determines if there are available redundant memory cells, step 510. If there are no available redundant memory cells an error 512 is indicated.

If available redundant memory cells are identified, the memory device programs redundant memory addresses 514, as described above. The redundant memory cells are separately erasable from the memory location of the primary defective memory cells. As such, the redundant memory cells can be erased prior to programming the redundant memory cells. Because a random memory cell failure can be encountered at any time, some of the primary memory cells may be programmed before the need for redundant memory cells is identified. The memory device, therefore, programs the redundant memory cells with data stored in the primary memory cell location, step 516. That is, if a redundant memory array column is used to replace a primary memory cell array column any data previously stored in the primary memory column is copied into corresponding memory cells of the redundant memory column. This extra operation prevents the loss of data which has been stored prior to detecting a defective memory cell.

The above described redundancy routines are representative methods of correcting for random memory cell failures which are encountered after a memory device has been packaged. Additional embodiments of the present invention are not limited to the specific examples provided herein, but can include different methods, or algorithms, which identify a defective memory cell and automatically program available redundant memory cell locations. Further, the present invention can be implemented in any memory device and is not limited to non-volatile memory devices such as flash memories, but can be incorporated in any memory device including DRAM, SRAM, SDRAM or the like.

CONCLUSION

A non-volatile memory device has been described which includes redundant memory cell locations which can be automatically programmed by the memory device when a random memory cell failure is detected. A method, or algorithm, has been described which detects random memory cell failures encountered during erase operations and programs the redundant memory cells to replace the defective memory cells. The second method has been described which detects random memory cell failures encountered during program operations and programs the redundant memory cells to replace the defective memory cells. It has been explained, that if the defective memory cell is detected during programming an additional operation of transferring data stored in primary memory cells needs to be performed to insurer that data is not lost. As such, the redundant memory cells need to be separately erasable to support this method.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   an array of primary memory cells;
   redundant memory cells;
   access circuitry coupled to the array of primary memory cells and the redundant memory cells for selectively accessing either primary memory cells or redundant memory cells in response to externally provided address signals;
   a plurality of non-volatile fuse cells coupled to the access circuitry to determine if the primary memory cells or above redundant memory cells are selectively accessed in response to the externally provided address signals; and
   control circuitry to detect a primary memory cell failure encountered during either a program or an erase operation, the control circuitry is coupled to the plurality of non-volatile fuse cells to selectively program the fuse cells in response to a detected failure, wherein the control circuitry detects a primary memory cell failure by monitoring a number of consecutive program operations performed on a primary memory cell.

2. The memory device of claim 1, wherein the array of primary memory cells comprise an array of flash memory cells.

3. The memory device of claim 1, wherein the redundant memory cells comprise flash memory cells.

4. The memory device of claim 1 wherein the control circuitry detects a primary memory cell failure by monitoring a number of consecutive erase operations performed on a primary memory cell.

5. The memory device of claim 1 wherein the memory device is a flash memory.

6. The memory device of claim 1 wherein the array of primary memory cells and the redundant memory cells are located in a common erasable memory block.

7. The memory device of claim 1 wherein the array of primary memory cells and the redundant memory cells are separately erasable.

8. A method of correcting random memory cell failures in a memory device, the method comprising:
   initiating a program operation on a plurality of primary memory cells;
   individually verifying each one of the plurality of primary memory cells to determine in each memory cell has been properly programed;
   applying one or more additional program operations on a defective one of the plurality of primary memory cells which fails to properly verify that the program operation was successful; and
   programming access circuitry to replace the defective memory cell with an available redundant memory cell.

9. The method of claim 8 wherein the program operation comprises applying a voltage pulse to the primary memory cell.

10. The method of claim 9 wherein the access circuitry is programmed after a predetermined number of voltage pulses has been applied to the primary memory cell.

11. The method of claim 8 wherein the plurality of primary memory cells and the available redundant memory cell are located in a separately erasable memory locations of the memory device, such that the redundant cell can be erased without erasing the primary memory cells.

12. The method of claim 8 wherein the access circuitry is programmed by selectively programming a plurality of non-volatile fuse cells.

13. The method of claim 8, wherein initiating the program operation on the plurality of primary memory cells comprises initiating the program of operation on a plurality of flash memory cells.

14. A method of correcting random memory cell failures in a memory device, the method comprising:
   initiating a program operation on a primary memory cell located in a first memory array column;
   detecting that the primary memory cell is defective;
   programming access circuitry to replace the first memory array column comprising the defective memory cell with an available redundant memory cell column of redundant memory cells; and
   copying data stored in the first memory array column to corresponding redundant memory cells located in the available redundant memory cell column, wherein detecting at the primary memory cell is defective comprises performing a plurality of consecutive program verification operations.

15. A method of correcting random memory cell failures in a memory device, the method comprising:
   initiating a program operation on a plurality of primary flash memory cells;

individually verifying each one of the plurality of primary flash memory cells to determine in each memory cell has been properly programed;

applying one or more additional program operations on a defective one of the plurality of primary flash memory cells which fails to properly verify that the program operation was successful; and programming access circuitry to replace the defective memory cell with an available redundant memory cell.

16. A method of correcting random memory cell failures in a memory device, the method comprising:

initiating a program operation on a plurality of primary dynamic random access memory (DRAM) cells;

individually verifying each one of the plurality of primary DRAM cells to determine in each memory cell has been properly programed;

applying one or more additional program operations on a defective one of the plurality of primary DRAM cells which fails to properly verify that the program operation was successful; and programming access circuitry to replace the defective memory cell with an available redundant memory cell.

17. A method of correcting random memory cell failures in a memory device, the method comprising:

initiating a program operation on a plurality of primary static random access memory (SRAM) cells;

individually verifying each one of the plurality of primary SRAM memory cells to determine in each memory cell has been properly programed;

applying one or more additional program operations on a defective one of the plurality of primary SRAM cells which fails to properly verify that the program operation was successful; and programming access circuitry to replace the defective memory cell with an available redundant memory cell.

18. A method of correcting random memory cell failures in a memory device, the method comprising:

initiating a program operation on a plurality of primary synchronous dynamic random access memory (SDRAM) cells;

individually verifying each one of the plurality of primary synchronous dynamic access memory (SDRAM) cells to determine in each memory cell has been properly programed;

applying one or more additional program operations on a defective one of the plurality of primary synchronous dynamic random access memory (SDRAM) cells which fails to properly verify that the program operation was successful; and programming access circuitry to replace the defective memory cell with an available redundant memory cell.

* * * * *